United States Patent [19]
Shah et al.

[11] Patent Number: 5,490,115
[45] Date of Patent: Feb. 6, 1996

[54] METHOD AND APPARATUS FOR WRITING TO MEMORY CELLS IN A MINIMUM NUMBER OF CYCLES DURING A MEMORY TEST OPERATION

[75] Inventors: Shailesh Shah, San Jose; Gregory J. Landry, Santa Clara, both of Calif.

[73] Assignee: Cypress Semiconductor Corp., San Jose, Calif.

[21] Appl. No.: 282,314

[22] Filed: Jul. 29, 1994

[51] Int. Cl.$^6$ .................................................. G11C 7/00
[52] U.S. Cl. ............................ 365/201; 371/21.3; 371/27
[58] Field of Search ........................... 365/201; 371/21.1, 371/21.2, 21.3, 27

[56] References Cited

U.S. PATENT DOCUMENTS

| | | |
|---|---|---|
| 4,701,919 | 10/1987 | Naitoh et al. .......................... 371/27 X |
| 4,788,684 | 11/1988 | Kawaguchi et al. .................... 371/27 X |
| 4,821,238 | 4/1989 | Tatematsu ................................ 365/201 |
| 4,885,748 | 12/1989 | Hoffmann et al. ...................... 371/21.3 |

*Primary Examiner*—David C. Nelms
*Assistant Examiner*—Son Dinh
*Attorney, Agent, or Firm*—Blakely, Sokoloff, Taylor & Zafman

[57] ABSTRACT

A computer memory system incorporates a gang write circuit block to reduce the number of clock cycles required write a background pattern to memory cells during a memory test operation. The computer memory system includes (1) a two-dimensional array having multiple memory cells arranged in M rows and N columns and (2) the gang write circuit block for writing to N memory cells located in a row during one cycle and for writing to all of the memory cells in M cycles. The gang write circuit block may include two inverters for each column of the memory array and two test signals for the inverters. The background pattern may be all 1's, all 0's or some combination of 1's and 0's. The gang write circuit block becomes inactive during a normal read and write operation. When all the word lines of the computer memory system are selected, all the memory cells are written simultaneously.

28 Claims, 11 Drawing Sheets

METHOD AND APPARATUS FOR WRITING TO MEMORY CELLS IN A MINIMUM NUMBER OF CYCLES DURING A MEMORY TEST OPERATION

BACKGROUND OF THE INVENTION

1. Field of the Invention

The present invention relates to the field of semiconductor memory and, more particularly, to testing of memory cells in semiconductor IC memory chips.

2. Description of the Related Art

FIG. 1 shows a typical computer memory system consisting of row decoders 10, column decoders 12, a memory array 14, sense amplifiers and write drivers 15 and a data buffer 16. Memory array 14 comprises individual memory cells arranged in rows and columns. Writing is accomplished by selecting an entire row (such as memory cells 100, 101 through 102) and selecting a column and by allowing data 19 to be written to the desired column. For each write cycle, only one memory cell is written because there is only one data buffer. During a normal operation, if there are 1,024 memory cells, it would require 1,024 write cycles to write the data to every memory cell. During a memory test operation, it is common to write a background pattern before running a specific test. In the example shown in FIG. 1, if there are 1,024 memory cells in memory array 14, since there is only one data buffer 16, it requires 1,024 write cycles to write a background pattern to memory array 14.

To reduce the number of write cycles required to write data to each memory cell, one can incorporate more data buffers as shown in FIG. 2. The computer memory system shown in FIG. 2 comprises row decoders 20, column decoders 22, memory array 24, sense amplifiers/write drivers 25 and data buffers 26. In this example, if there are 1,024 memory cells in memory array 24, it would require 256 (equal to 1,024 divided by 4) write cycles to write to each memory cell, and thus require 256 write cycles to write a background pattern to memory array 24. As one increases the number of data buffers, the number of required write cycles can be reduced. However, the number of data buffers is limited to the width of a data bus and the amount of realistic area that can be designated for data buffers. In the example shown in FIG. 2, there are four data buffers and the width of the data bus is four. Because of the limitation due to the width of the data bus and the realistic area available for data buffers on a chip (given that the transistor devices for these drivers should be large), it is not practical to include a large number of data buffers.

The present invention solves the problems stated above by incorporating a gang write circuitry consisting of small devices for writing a background pattern to memory cells during a memory test operation.

BRIEF SUMMARY OF THE INVENTION

The present invention provides a memory system for reducing the number of clock cycles required to write a background pattern to memory cells during a memory test operation. The memory system includes (1) a two-dimensional array having multiple memory cells arranged in M rows and N columns and (2) a gang write circuit block for writing to N memory cells located in a row during one cycle and for writing to all of the memory cells in M cycles during the memory test operation. The background pattern may be all 1's, all 0's or some combination of 1's and 0's. The gang write circuit block becomes inactive during a normal read and write operation. It should be noted that during a power-up mode, all the word lines of the computer memory system may be selected to write to all the memory cells simultaneously.

The gang write circuit block contains at least one inverter for each column of the memory array and at least one test signal as shown in FIG. 7. The preferred embodiment of the present invention includes two inverters for each column of the memory array and two test signals for the inverters, as shown in FIG. 3. As discussed below, the present invention may include as many test signals as twice the number of the columns of the memory array to provide various background patterns.

DETAILED DESCRIPTION OF THE INVENTION

Figure 3:
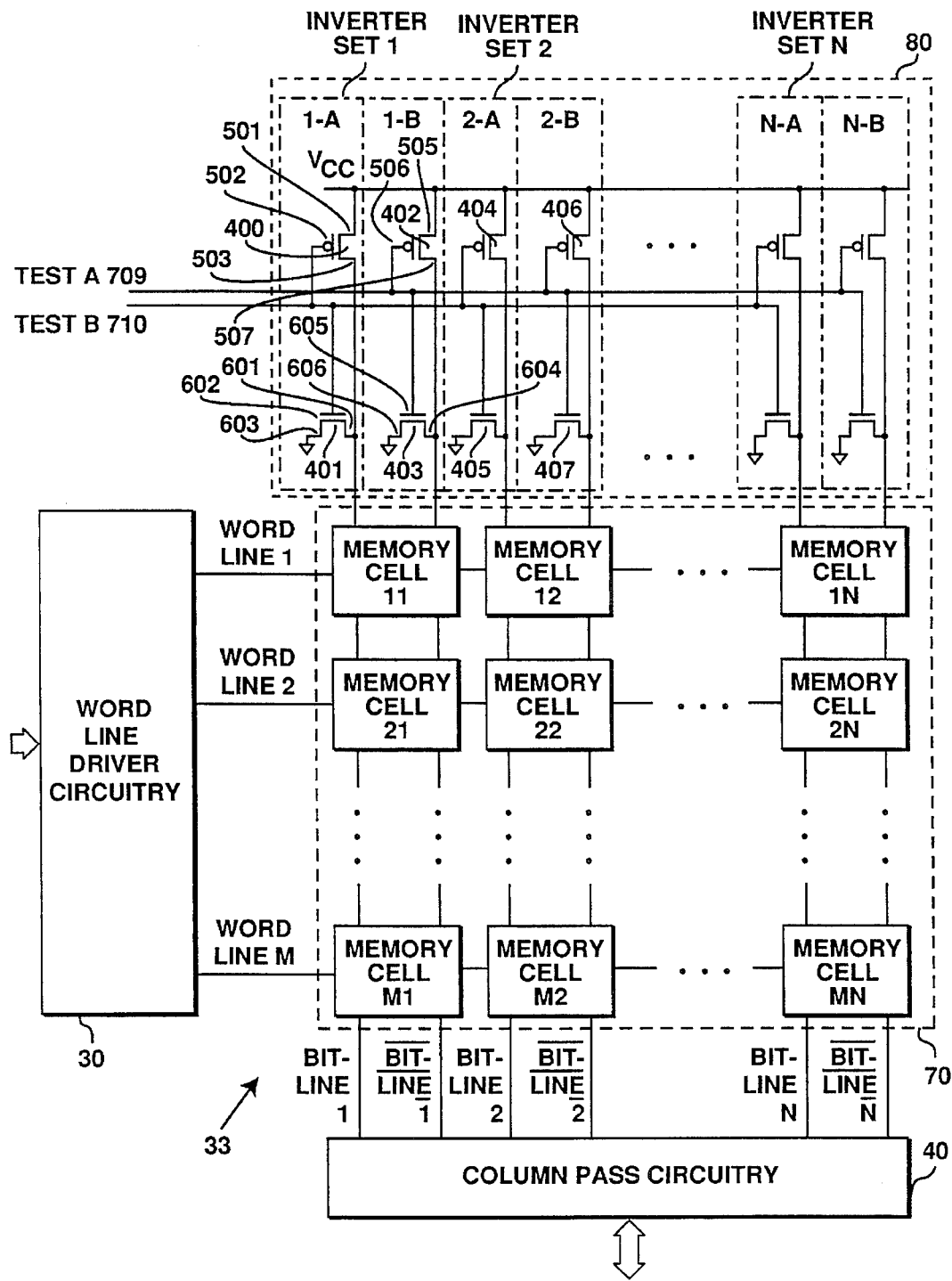
FIG. 3 is a memory system with a gang write circuit block according to the preferred embodiment of the present invention.

The present invention provides a method and apparatus for reducing the number of cycles required to write a background pattern to memory cells during a memory test operation. FIG. 3 shows the preferred embodiment of the present invention. An integrated circuit memory system 33 according to the present invention includes a word line driver circuitry 30, a column pass circuitry 40, a memory array 70, a plurality of word lines, a plurality of bit lines, plurality of bit lines/ and a gang write circuit block 80. It should be noted that a signal named xxx/ or $\overline{xxx}$ represents a logical inversion of the signal xxx. For example, bit line/ 1 or $\overline{bitline1}$ is a logical inversion of bit line 1.

Memory array 70 includes a plurality of memory cells denoted as memory cell 11, memory cell 12, through memory cell MN, wherein the letter M represents the number of the rows in memory array 70, and the letter N represents the number of the columns in memory array 70. Each memory cell exhibits either of two logic states 1 or 0—high or low—and stores the corresponding charge. Each memory cell constitutes one bit. Thus, by multiplying the number of word lines by the number of bit lines (M×N), one can compute the storage capacity, the total number of bits in a memory. For example, if M equals 128 and N equals 512, then the total number of bits in memory array 70 is 65,536 (128 times 512). While each row has one word line, each column of memory array 70 has two bit lines comprising bit line X and bit line/ X, wherein X is an integer 1 through N. As stated above, bit line/ X is a complementary signal of bit line X.

Gang write circuit block 80 comprises a plurality of inverter sets denoted as inverter set 1, inverter set 2, through inverter set N. Each inverter set is connected to a column of memory array 70. For example, inverter set 1 is coupled to column 1 of memory array 70, and inverter set N is coupled to column N of memory array 70. While one inverter of an inverter set is coupled to a bit line, the other inverter of the inverter set is coupled to a bit line/. It will be appreciated that other types of logic may be used instead of inverters in the gang write circuitry, which logic may comprise conventional driver circuitry to drive the bitlines to one binary state or the other binary state.

Referring to FIG. 3, an inverter 1-A is coupled to bit line 1 while an inverter 1-B is coupled to bit line/ 1. Similarly, an inverter 2-A is coupled to bit line 2, and an inverter 2-B is coupled to bit line/ 2. The remaining inverters are coupled to other bit lines and bit lines/ in a similar fashion. Each inverter of gang write circuit block 80 comprises a P-channel MOSFET and an N-channel MOSFET, wherein a P-channel MOSFET has a drain, a gate and a source, and an N-channel MOSFET has a drain, a gate and a source.

A source of a P-channel MOSFET is coupled to $V_{cc}$. A gate of a P-channel MOSFET is coupled to a gate of an N-channel MOSFET and to either of a test A signal 709 or a test B signal 710. A drain of a P-channel MOSFET is coupled to a drain of an N-channel MOSFET and to either of a bit line or a bit line/. A source of an N-channel MOSFET is coupled to ground. A first inverter of an inverter set that is coupled to a bit line can be coupled to either test A signal 709 or test B signal 710. Likewise, a second inverter of an inverter set that is coupled to a bit line/ can be coupled to either test A signal 709 or test B signal 710. However, both inverters of an inverter set cannot be connected to the same test signal. So if the first inverter is connected to test A signal 709, then the second inverter is connected to test B signal 710. On the other hand, if the first inverter is connected to test B signal 710, the second inverter is connected to test A signal 709.

Continuing to refer to FIG. 3, for illustration, the connections between inverter set 1 and column 1 of memory array 70 and among the various signals of inverter set 1 are described in detail. Inverter set 1 includes inverter 1-A and inverter 1-B, wherein inverter 1-A is coupled to bit line 1 of column 1, and inverter 1-B is coupled to bit line/ 1 of column 1 of memory array 70. Inverter 1-A comprises a P-channel MOSFET 400 and an N-channel MOSFET 401. P-channel MOSFET 400 has a drain 503, a gate 502 and a source 501. N-channel MOSFET 401 has a drain 601, a gate 602 and a source 603. Source 501 of P-channel MOSFET 400 is coupled to $V_{cc}$. Gate 502 of P-channel MOSFET 400 is connected to gate 602 of N-channel MOSFET 401 and to test B 710. Drain 503 of P-channel 400 is coupled to drain 601 of N-channel MOSFET 401 and to bit line 1 of column 1 of memory array 70. Source 603 of N-channel MOSFET 401 is coupled to ground.

Continuing to refer to FIG. 3, inverter 1-B includes a P-channel MOSFET 402 and an N-channel MOSFET 403. P-channel 402 has a source 505, a drain 507 and a gate 506, and N-channel MOSFET 403 has a drain 604, a gate 605 and a source 606. Source 505 of P-channel MOSFET 402 is coupled to $V_{cc}$. Gate 506 of a P-channel MOSFET 402 is coupled to gate 605 of N-channel MOSFET 403 and to test A 709. Drain 507 of P-channel MOSFET 402 is coupled to drain 604 of N-channel MOSFET 403 and to bit line/ 1. Source 606 of N-channel MOSFET 403 is coupled to ground. The remaining inverters are coupled to the test signals and the columns of memory array 70 in a similar fashion.

Figure 1:
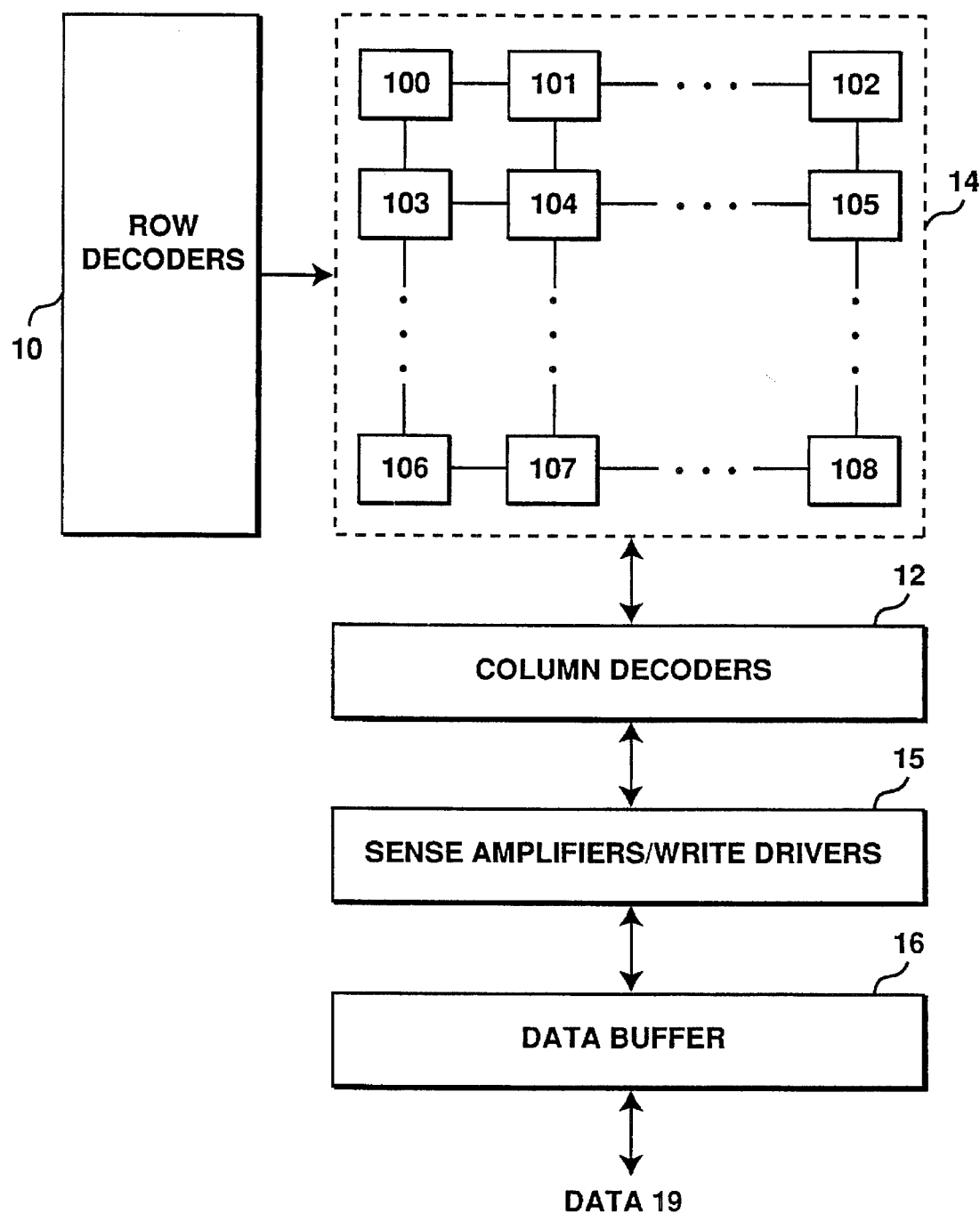
FIG. 1 is a prior art memory system having one data buffer.
Figure 2:
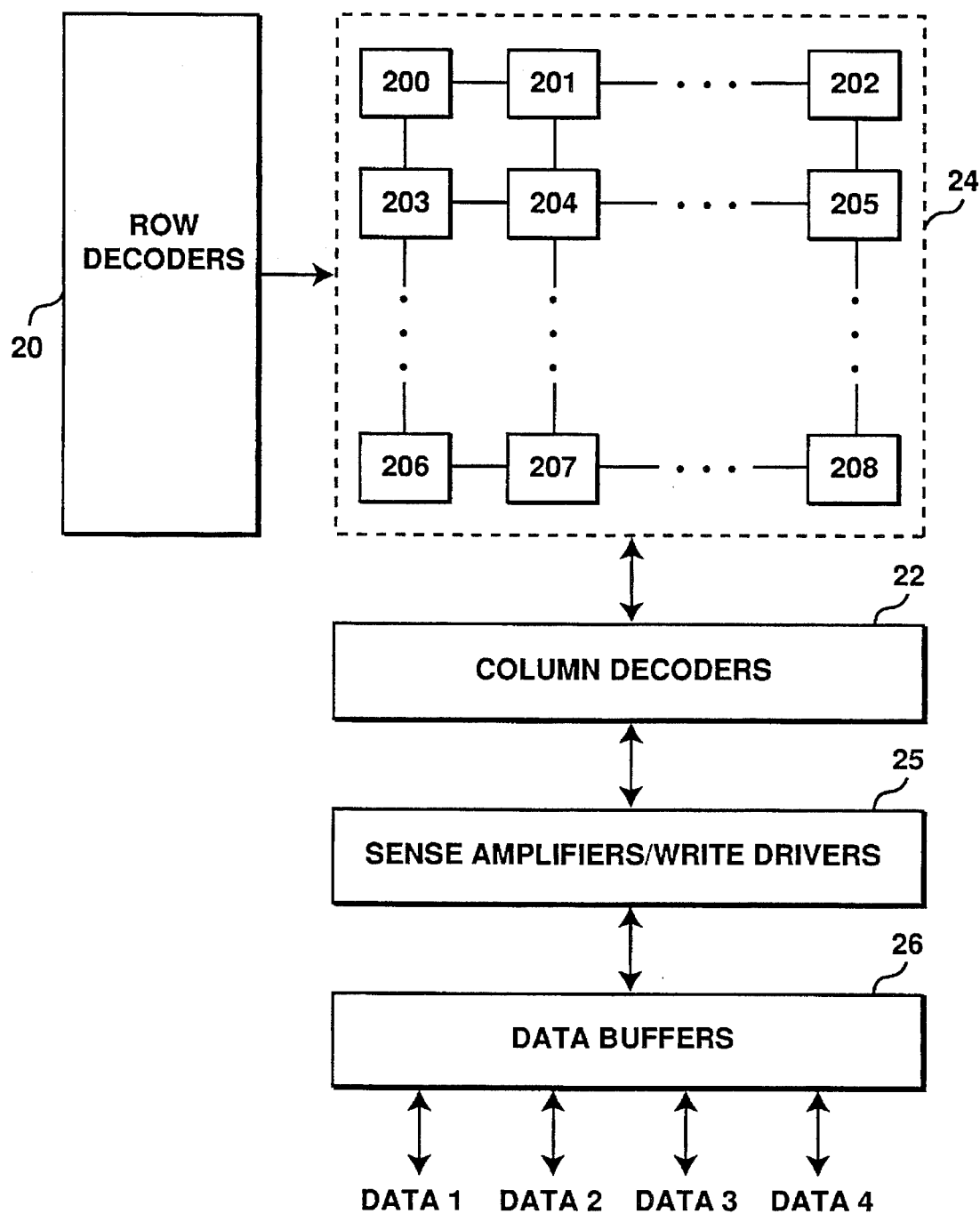
FIG. 2 is a prior art memory system having four data buffers.

During a memory test operation of memory system 33 shown in FIG. 3, gang write circuit block 80 is used to write a background pattern before running a specific test because gang write circuit block 80 can reduce the number of cycles required to write a background pattern. A background pattern can be any pattern including all 1's, all 0's or some combination of 1's and 0's. Small transistor devices in the inverters in the gang write circuitry (that is, smaller than the data buffers used in the prior art such as buffers 26 of FIG. 2), may be used because the operation of the inverter naturally disables the bitline load from inverters of the gang write circuitry; that is, one device in the inverter will be "off" while the other is "on" so that the bitline load from the inverter is disabled during test mode operation so that smaller devices may be used. The use of smaller devices conserves space on the semiconductor IC.

Figure 4A:
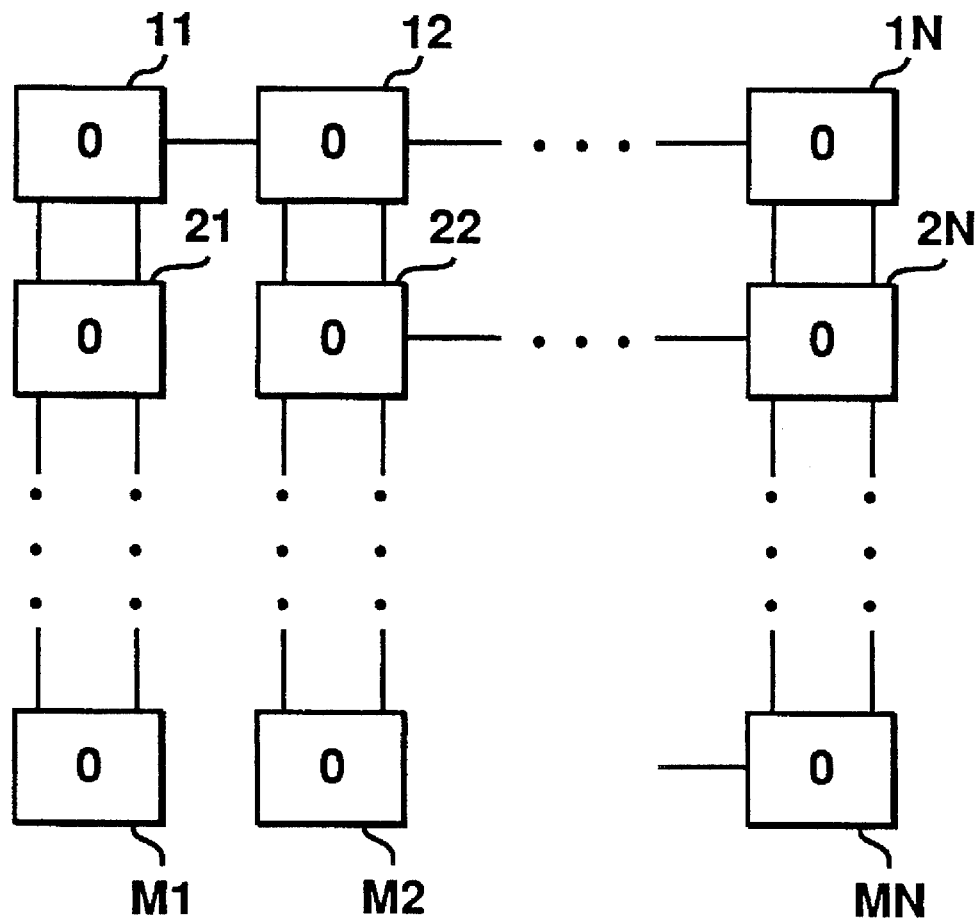
FIG. 4A presents a background pattern having all 0's.
Figure 4B:
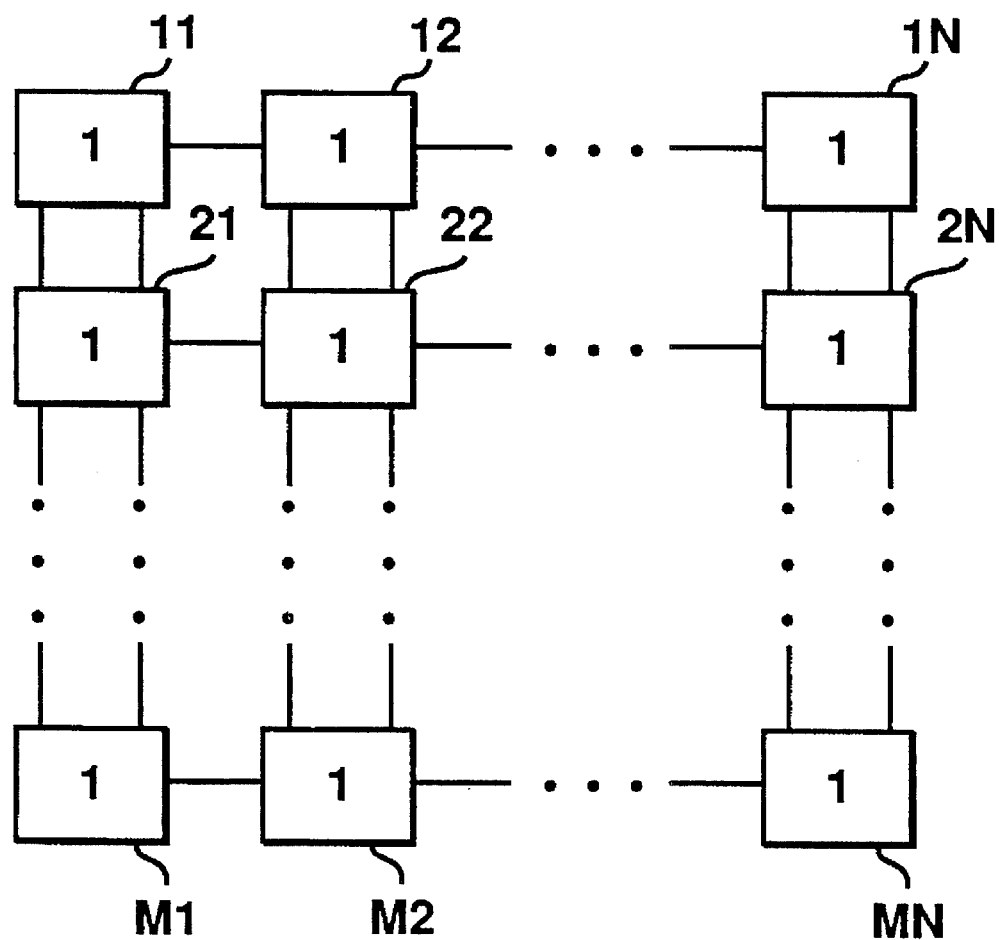
FIG. 4B presents a background pattern having all 1's.
Figure 4C:
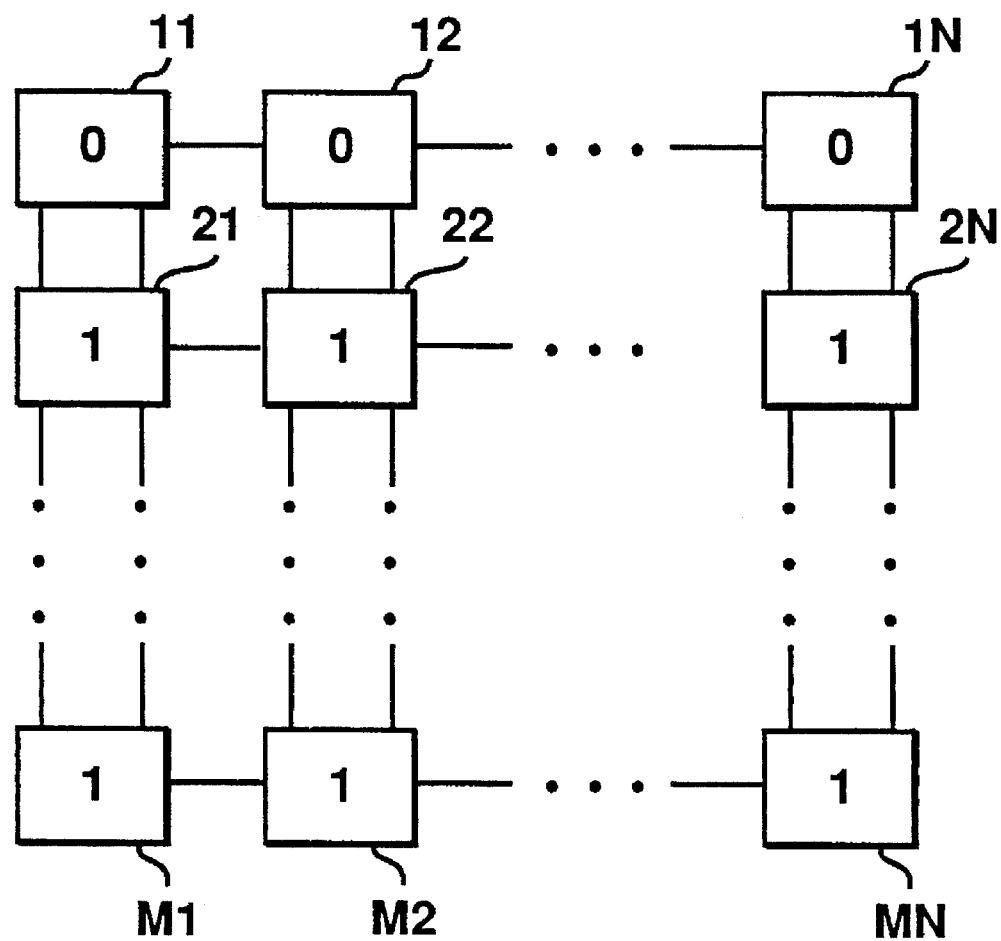
FIG. 4C presents a background pattern having either all 0's or all 1's on a given row.

Gang write circuit block 80 incorporates one pair of test signals 709 and 710 so that memory cells 11 through MN can have all 0's as shown in FIG. 4A or all 1's as shown in FIG. 4B or some combination of 1's and 0's as shown in FIG. 4C. In FIG. 4C, each row is limited to having either of all 1's or all 0's. During a normal operation, both test A 709 and test B 710 are held low, so that the output or drain of each inverter stays high, making the inverters act as pullup devices for the bitlines. But during a memory test operation, test A 709 and test B 710 are complementary of each other so that if test A 709 is high, then test B 710 is low, and if test A 709 is low, then test B 710 is high.

Again, referring to FIG. 3, writing a background pattern according to the present invention to memory array 70 is described below. First, to write all 1's as shown in FIG. 4B to memory cells 11 through MN, test A 709 is pulled to a logic 1 (high) and test B 710 is pulled to a logic 0 (low). During a first clock cycle, if word line 1 is chosen, then memory cells 11 through lN, connected to word line 1, are written. If test A 709 is high, N-channel MOSFET 403 of inverter 1-B is on, and P-channel MOSFET 402 of inverter 1-B is off. As a consequence, drain 604 of N-channel MOSFET 403 is pulled low, and bit line/ 1 is pulled low. At the same time, because test A 709 is high, test B 710 is low. As a result, N-channel MOSFET 401 of inverter 1-A is off, and P-channel 400 is on, causing drain 503 of P-channel MOSFET 400 to be pulled high, and causing bit line 1 to be pulled high.

When a bit line is high and a bit line/ is low, the state of a memory cell can be treated as a logic 1 or a logic 0. For the following discussions, the state of a memory cell is considered to be a logic 1 when a bit line is high and a bit line/ is low. When a bit line is low and a bit line/ is high, the state of a memory cell will be considered to be a logic 0, although such designation (logic 1 or logic 0) is arbitrary.

In this example, because bit line 1 is high and bit line/ 1 is low, a logic 1 is written to memory cell 11. Because inverter sets 2 through N are connected to test A 709, to test B 710 and to memory cells 12 through lN, a logic 1 is also written to memory cells 12 through lN at the same time and in a similar matter as a logic 1 is written to memory cell 11. Thus, during the first clock cycle, each of the memory cells 11 through 1N connected to word line 1 receives a logic 1 at the same time.

Similarly, during a second clock cycle, if word line 2 is chosen, logic 1's are written to memory cells 21 through 2N. The same process is repeated for word lines 3 through M. Thus, a solid pattern of all 1's such as the one shown in FIG. 4B is written to "N" memory cells at a time, and the entire array is written in "M" cycles.

Second, all 0's as shown in FIG. 4A can be written to memory array 70 in a similar manner. In this case, test A 709 is pulled low, while test B 710 is pulled high. To write all 0's to all cells of memory cells 11 through MN, it would require M clock cycles. During the M clock cycles, while test A 709 remains low, test B 710 remains high. The output (or drain) of each inverter X-A, where X is 1 through N, is pulled low, causing each bit line X, where X is 1 through N, to be low (logic 0). The output (or drain) of each inverter X-B, wherein X is 1 through N, is pulled high, causing each of bit line/ X where X is 1 through N, to be pulled high. Because each bit line is pulled low and bit line/ is pulled high, each memory cell is written with a logic 0. Again, logic 0's are written to "N" memory cells at a time, and it requires "M" clock cycles to write to the entire array 70.

Third, if test A 709 and test B 710 change values for different clock cycles, different rows may contain different logic values as shown in FIG. 4C, although each row contains the same logic value. For example, during a first clock cycle, if test A 709 is pulled low and test B signal 710 is pulled high, memory cells 11 through IN will receive logic 0's as shown in FIG. 4C. During a second clock cycle, if test A 709 is high, and test B 710 is low, memory cells 21 through 2n receive logic 1's. Furthermore, during an Mth clock cycle, if test A 709 is high, and test B 710 is low, memory cells M1 through MN on row M will all contain logic 1's. Thus, when test A 709 and test B 710 change their values during different clock cycles, one can obtain a background pattern consisting of some combination of logic 1's and 0's although each row contains the same logic value.

It should be noted that during a power-up mode, all the word lines 1 through M may be active to write to all the memory cells simultaneously.

Figure 5:
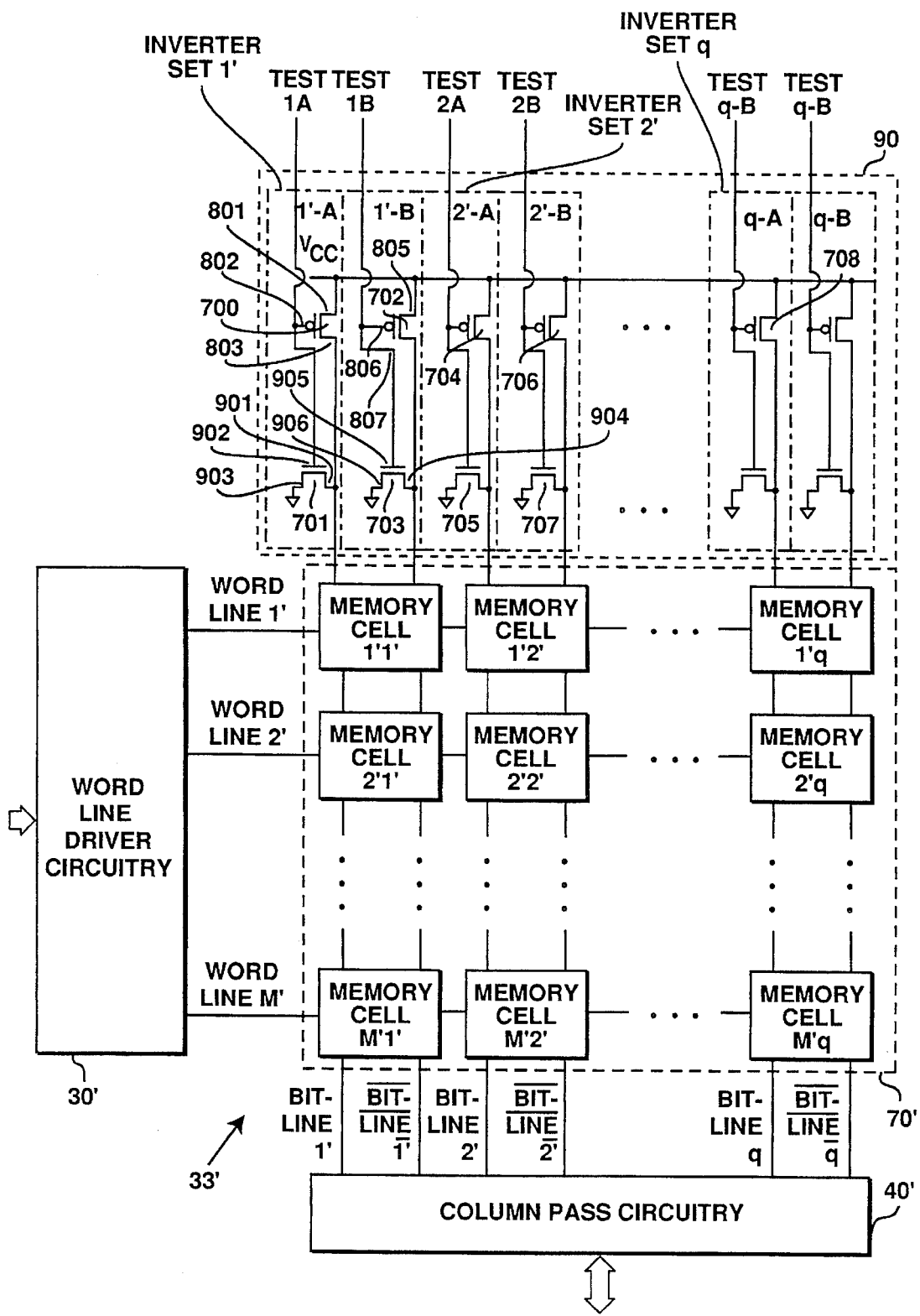
FIG. 5 is a memory system with a gang write circuit block having multiple test signal pairs in accordance with the second embodiment of the present invention.
Figure 6:
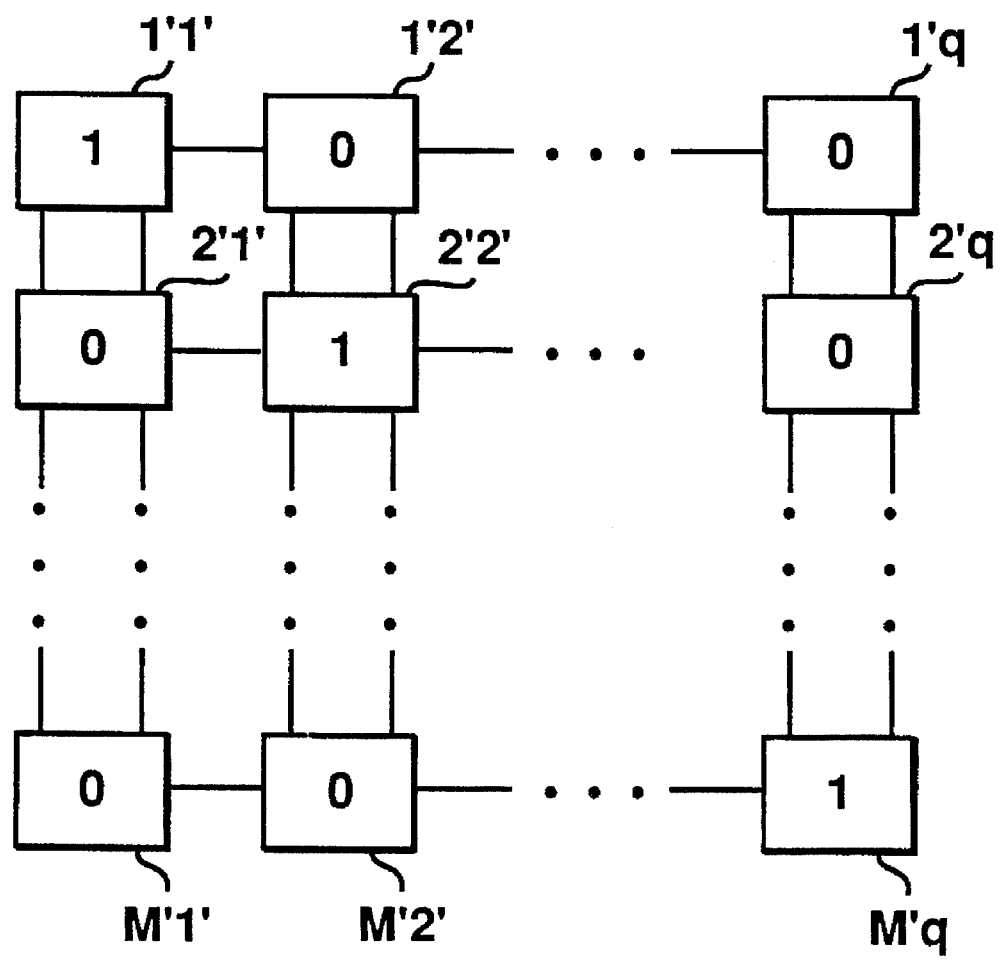
FIG. 6 presents a background pattern where each memory cell has a logic 0 or logic 1 value.

Instead of incorporating one pair of test signals such as test A 709 and test B 710 as shown in FIG. 3, gang write circuit block 80 may incorporate one test signal or multiple pairs of test signals. In FIG. 5, gang write circuit block 90 incorporates q pairs of test signals for q columns of memory cells. FIG. 5 shows the maximum number of test signal pairs that may be incorporated in a gang write circuit block coupled to a memory array having two bit lines for each column. When the number of test signal pairs is limited to one pair as shown in FIG. 3, the different combinations of background patterns are limited to all 1's, all 0's or at least the same logic values for a given row of memory cells, as shown in FIGS. 4A, 4B and 4C. As one increases the number of test signals, the number of different patterns that can be implemented increases. When one incorporates the same number of pairs of test signals as the number of columns in the memory array, one will obtain the maximum number of patterns possible. FIG. 6 is one example of background patterns that can be written by gang write circuit block 90.

Now referring to FIG. 5, a memory system 33' has gang write circuit block 90, a word line driver circuitry 30', a column pass circuitry 40', a plurality of word lines 1' through M', a plurality of bit lines 1' through q, a plurality of bit lines/ 1' through q and a memory array 70'.

Gang write circuit block 90 comprises a plurality of inverter sets-inverter sets 1' through q. Each inverter set includes two inverters. For example, inverter set 1' has an inverter 1'-A and an inverter 1'-B. Each inverter has a P-channel MOSFET and an N-channel MOSFET like the inverter in FIG. 3. The structure and electrical connections of each inverter in FIG. 5 are similar to that of FIG. 3 except that each inverter in FIG. 5 is coupled to its own test signal whereas in FIG. 3, a half of the inverters are connected to test A 709 and the remaining inverters are connected to test B 710.

During a normal operation, all test signals 1A through qB are held low so that the output of each inverter is held high, and gang write circuit block becomes inactive. But during a memory test operation, test signal x-A becomes complementary of test signal x-B where x is 1 through q.

FIG. 6 presents a background pattern generated by memory system 33' to show that any pattern of 1's and 0's can be obtained when the number of inverter sets is the same as the number of columns in memory 70'. Thus, a given row is not limited to having only 1's or only 0's. In this example, it is assumed for convenience that a memory cell has a logic 1 when the bit line of that cell is high while the bit line/ of that cell is low. This convention may be reversed. During a first clock cycle of a memory test operation, word line 1' is selected. To generate a logic 1 in cell 1'1', test 1A is held low, while test 1B is held high. To produce a logic 0 in cells 1'2' and 1'q, test 2A and test qA are held high (logic 1), while test 2B and test qB are held low (logic 0). Word line 2' is selected during a second clock cycle, and depending on the values of the test signals, various logic levels can be stored in memory cells 2'1' through 2'q. When the Mth clock cycle, is complete, the entire memory array 70' will have valid logic values.

Figure 7:
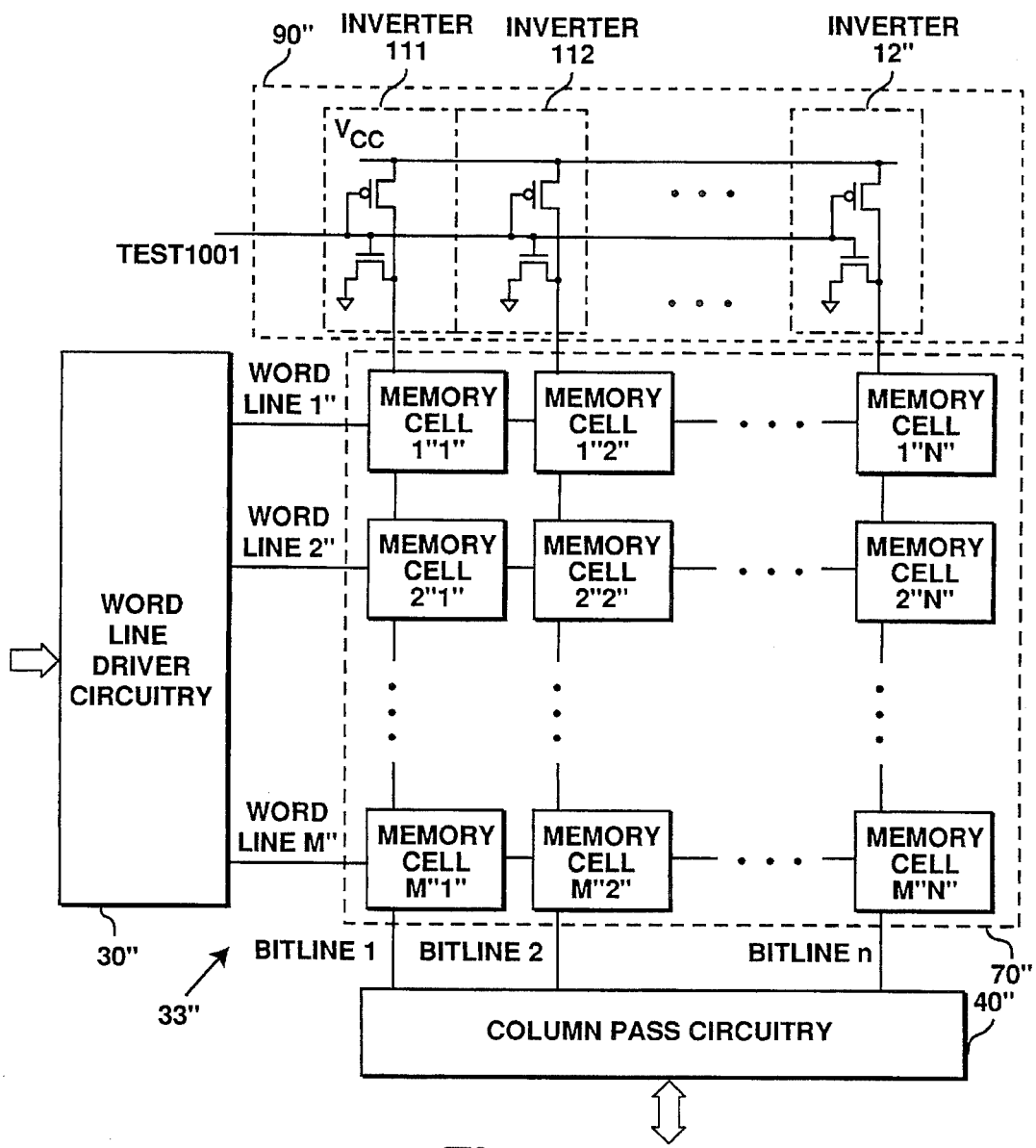
FIG. 7 is a memory system with a gang write circuit block having one test signal according to the third embodiment of the present invention.

FIG. 7 presents a memory system 33'' with a gang write circuit block 90'' having only one test signal 1001. When a gang write circuit block incorporates only one test signal, a background pattern can be all 1's, all 0's or the same logic values for each row of memory cells, as shown in FIGS. 4A, 4B and 4C.

Figure 8:
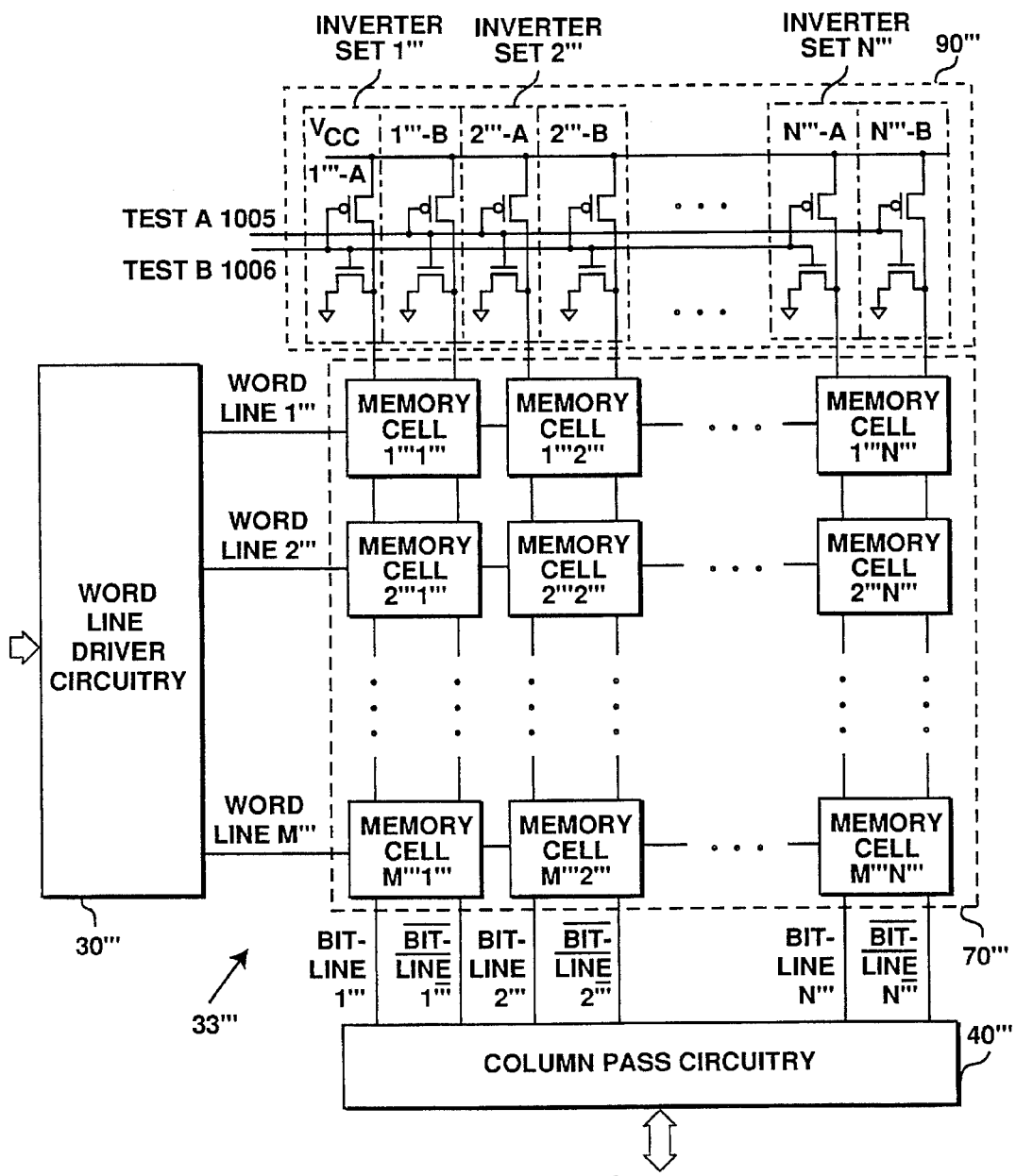
FIG. 8 is a system with a gang write circuit block according to the fourth embodiment of the present invention.

FIG. 8 presents a memory system 33''' with a gang write circuit block 90''' having two test signals 1005 and 1006 according to another embodiment of the present invention. Memory system 33''' is similar to computer memory system 33 of FIG. 3 except that an inverter 2'''-A is connected to test A 1005, and an inverter 2'''-B is coupled to test B 1006. In FIG. 3, all X-A's (that is, group A inverters) are connected to one test signal, and all X-B's (group B inverters) are connected to another test signal where X is 1 through N. However, in FIG. 8, although an X-A and an X-B of a given inverter set can not be connected to the same test signal, an X-A and another X-A inverters may or may not be connected to the same test signal where X is 1''' through N'''. For instance, while 2'''-A and 2'''-B are connected to two different test signals, test A 1005 and test B 1006, respectively, 1'''-A and 2'''-A are also connected to two different test signals, test B 1006 and test A 1005, respectively. In memory system 33''', a row of memory cells may contain a pattern including, but not limited to, multiple 0's and multiple 1's, a single 1 and multiple 0's, a single 0 and multiple 1's, all 1's, or all 0's, depending on the actual values of the test signals 1005 and 1006 and whether each inverter is connected to test A 1005 or test B 1006.

While FIG. 7 shows the minimum number of test signal pairs, FIG. 5 shows the maximum number of test signal pairs where each column of the memory array contains a bit line and a bit line/. A memory system may have any number of test signals depending on the complexity of the background patterns desired and the amount of real estate that may be allocated for a gang write circuit block.

Figure 9:
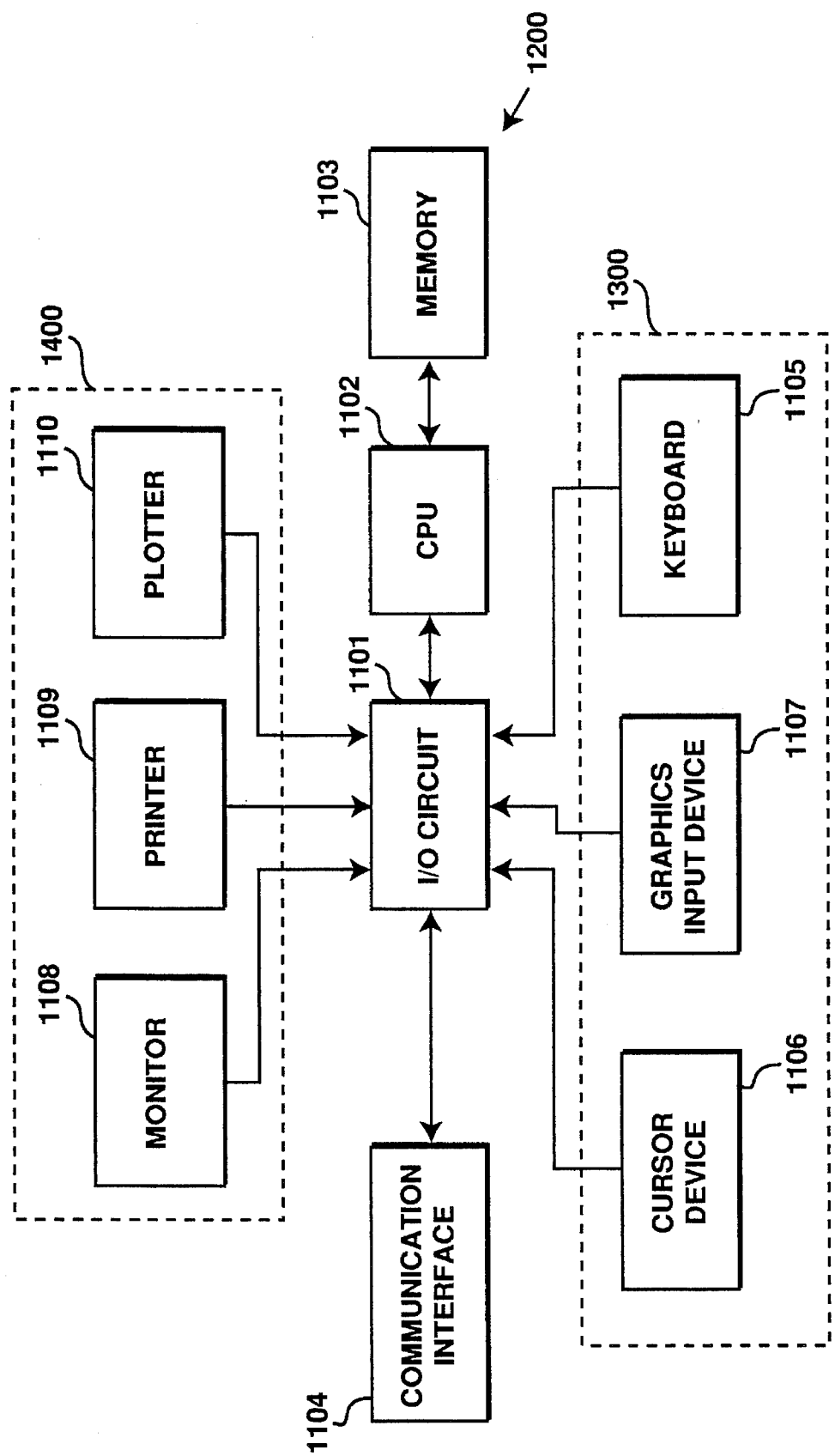
FIG. 9 presents a general purpose computer incorporating a memory system of the present invention.

The memory system of the present invention may be added to a general purpose computer system 1200 as shown in FIG. 9. Computer system 1200 includes an I/O circuit 1101, a central processing unit (CPU) 1102, a memory 1103, input devices 1300, output devices 1400 and a communication interface 1104. I/O circuit 1101 is used to communicate information to and from other parts of computer 1200 as well as outside of computer 1200.

Memory 1103 may include but is not limited to internal memories, external mass memories, ROM and RAM. The present invention may be incorporated as a part of memory 1103.

Input devices 1300 may include a cursor device 1106 such as a mouse trackball or stylus, a graphics input device 1107 such as an image scanner and a keyboard 1105. Output devices 1400 may include a display monitor 1108, a printer 1109 and a plotter 1110. Communication interface 1104 may be a serial or parallel communication port or may be a communication modem.

While the present invention has been particularly described with reference to FIGS. 1 through 9, it should be understood that the figures are for illustration only and should not be taken as limiting the scope of the invention. Many changes and modifications may be made to the invention, by one having ordinary skill in the art, without departing from the spirit and scope of the invention as disclosed herein.

What is claimed is:

1. A memory system for writing a background pattern to a plurality of memory cells, said memory system comprising:
    a two-dimensional array having said plurality of said memory cells arranged in M rows and N columns;
    each of said rows coupled to a corresponding word line, each of said columns coupled to a corresponding first bit line;
    a word line control circuitry for controlling said word lines, said word line control circuitry coupled to said word lines;
    a gang write circuitry having a plurality of driver circuits, said plurality of driver circuits comprising a plurality of inverter sets, said gang write circuitry coupled to said two-dimensional array.

2. A memory system for writing a background pattern to a plurality of memory cells, said memory system comprising:
    a two-dimensional array having said plurality of said memory cells arranged in M rows and N columns;
    each of said rows coupled to a corresponding word line, each of said columns coupled to a corresponding first bit line;
    a word line control circuitry for controlling said word lines, said word line control circuitry coupled to said word lines;
    a gang write circuitry having a plurality of driver circuits, said gang write circuitry coupled to said two-dimensional array, wherein said driver circuits comprise a plurality of inverter sets and each of said plurality of inverter sets having a corresponding first inverter, each of said first inverters having a corresponding first output and a corresponding first input;
    each of said first outputs coupled to a corresponding one of said first bit lines, each of said first inputs coupled to a corresponding first test signals and further comprising:
    each of said columns coupled to a corresponding second bit line;
    each of said plurality of inverter sets further including a corresponding second inverter, each of said second inverters having a corresponding second output and a corresponding second input;
    each of said second output coupled to a corresponding one of said second bit lines, each of said second inputs coupled to a corresponding second test signal;
    wherein said gang write circuitry is inactive during a non-test read and write operation.

3. The memory system according to claim 2 wherein some of said first test signals are coupled to one another, and some of said second test signals are coupled to one another.

4. The memory system according to claim 2 wherein all of said first test signals are coupled to each other so that all of said first inverters are controlled by one first test signal, and all of said second test signals are coupled to each other so that all of said second inverters are controlled by one second test signal and further comprising a column pass circuitry for controlling said first bit lines, said column pass circuitry coupled to said first bit lines.

5. The memory system according to claim 4 wherein each of said first inverters has a corresponding first PMOS transistor having a gate, a source and a drain and a corresponding first NMOS transistor having a gate, a source and a drain,
    said gates of said corresponding first PMOS transistor and first NMOS transistor being coupled to said one first test signal, said drains of said corresponding first PMOS transistor and first NMOS transistor coupled to a corresponding one of said first bit lines, said source of said corresponding first PMOS transistor being coupled to a first power supply, said source of said corresponding first NMOS transistor being coupled to ground;
    wherein each of said second inverters has a corresponding second PMOS transistor having a gate, a source and a drain and a corresponding second NMOS transistor having a gate, a source and a drain,
    said gates of said corresponding second PMOS transistor and second NMOS transistor being coupled to said one second test signal, said drains of said corresponding second PMOS transistor and second NMOS transistor coupled to a corresponding one of said second bit lines, said source of said corresponding second PMOS transistor being coupled to said first power supply, said source of said corresponding second NMOS transistor being coupled to said ground.

6. The memory system according to claim 2 wherein said background pattern is a pattern of logical states in said plurality of memory cells selected from a group consisting of: (1) all 0's, (2) all 1's, and (3) any combination of 0's and 1's.

7. The memory system according to claim 2 wherein said background pattern is a pattern of logical states in said plurality of memory cells selected from a group consisting of: (1) all 0's, (2) all 1's, and (3) some combination of 0's and 1's wherein memory cells in a given row contains only one of all 0's and all 1's.

8. The memory system according to claim 5 wherein to write a background pattern to all of said plurality of memory cells having one logical state, said one second test signal is high, said one first test signal is low, each of said first bit lines is high, and each of said second bit lines is low during each clock cycle.

9. The memory system according to claim 5 wherein to write a background pattern to all of said plurality of memory cells having one logical state, said one first test signal is high, said one second test signal is low, each of said first bit lines is low, and each of said second bit lines is high during each clock cycle.

10. The memory system according to claim 2 wherein during a memory test operation said gang write circuitry writes to N memory cells located in a row during one cycle and writes to all of said plurality of memory cells in M cycles.

11. The memory system according to claim 2 wherein some of said first test signals are coupled to one another so that some of said first inverters are controlled by one first test signal.

12. The memory system according to claim 2 wherein all of said first test signals are coupled together so that all of said first inverters are controlled by one first test signal.

13. The memory system according to claim 2 wherein each of said first outputs and each of said second outputs are high during said non-test read and write operation.

14. A method for writing a background pattern to an array having a plurality of memory cells arranged in M rows and N columns, said array being coupled to a gang write circuitry, said gang write circuitry having a plurality of driver circuits, said plurality of driver circuits comprising a plurality of inverter sets, said method comprising the steps of:

writing to all of said plurality of memory cells during a memory test operation to produce said background pattern using said gang write circuitry wherein said gang write circuitry is inactive during a non-test read and write operation.

15. The method according to claim 14 wherein said step of writing to all of said plurality of memory cells comprises the steps of:

(a) writing to N memory cells in a row during one cycle;

(b) repeating the step of (a) for M cycles until all of said plurality of memory cells are written.

16. A memory system for writing a background pattern to a plurality of memory cells, said memory system comprising:

a two-dimensional array having said plurality of memory cells arranged in M rows and N columns;

a gang write circuitry comprising a plurality of inverters and a test control signal, said plurality of inverters generating said background pattern, said test control signal coupled to each of said plurality of inverters, said gang write circuitry for writing to said plurality of memory cells during a memory test operation to produce said background pattern, said gang write circuitry being inactive during a non-test read and write operation, said gang write circuitry coupled to said two-dimensional array.

17. The memory system according to claim 16 wherein said gang write circuitry writes to N memory cells located in a row during one cycle and writes to all of said plurality of memory cells in M cycles during said memory test operation.

18. The memory system according to claim 16 wherein said background pattern is a pattern of logical states in said plurality of memory cells selected from a group consisting of: (1) all 0's, (2) all 1'2, and (3) some combination of 0's and 1's.

19. The memory system according to claim 16 wherein each of said plurality of inverters has an output coupled to a corresponding one of said columns, said output being high when said gang write circuitry is inactive.

20. The memory system according to claim 16 wherein when all of said M rows of said memory system are active, all of said plurality of memory cells are written simultaneously.

21. The memory system according to claim 1 wherein said background pattern is a pattern of logical states in said plurality of memory cells selected from a group consisting of: (1) all 0's, (2) all 1's, and (3) any combination of 0's and 1's.

22. The memory system according to claim 1 wherein during a memory test operation said gang write circuitry writes to N memory cells located in a row during one cycle and writes to all of said plurality of memory cells in M cycles.

23. The memory system according to claim 1 wherein when all of said M rows of said memory system are active, all of said plurality of memory cells are written simultaneously.

24. The memory system according to claim 2 wherein when all of said M rows of said memory system are active, all of said plurality of memory cells are written simultaneously.

25. The method according to claim 14 wherein when all of said M rows of said memory system are active, all of said plurality of memory cells are written simultaneously.

26. A method for writing a background pattern to an array having a plurality of memory cells arranged in M rows and N columns, said array being coupled to a gang write circuitry, said gang write circuitry having a plurality of inverters and a test control signal, said plurality of inverters generating said background pattern, said test control signal coupled to each of said plurality of inverters, said method comprising the steps of:

writing to all of said plurality of memory cells during a memory test operation to produce said background pattern using said gang write circuitry wherein said gang write circuitry is inactive during a non-test read and write operation.

27. The method according to claim 26 wherein said step of writing to all of said plurality of memory cells comprises the steps of:

(a) writing to N memory cells in a row during one cycle;

(b) repeating the step of (a) for M cycles until all of said plurality of memory cells are written.

28. The method according to claim 26 wherein when all of said M rows of said memory system are active, all of said plurality of memory cells are written simultaneously.

* * * * *